(12) United States Patent
Chang Chien et al.

(10) Patent No.: US 11,916,035 B2
(45) Date of Patent: Feb. 27, 2024

(54) PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Nan-Chun Lin, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 17/392,274

(22) Filed: Aug. 3, 2021

(65) Prior Publication Data

US 2022/0045028 A1 Feb. 10, 2022

Related U.S. Application Data

(60) Provisional application No. 63/061,807, filed on Aug. 6, 2020.

(30) Foreign Application Priority Data

Jun. 29, 2021 (TW) .............................. 110123671

(51) Int. Cl.
*H01L 23/00* (2006.01)
*H01L 23/48* (2006.01)
(Continued)

(52) U.S. Cl.
CPC ............. *H01L 24/73* (2013.01); *H01L 24/19* (2013.01); *H01L 24/20* (2013.01); *H01L 24/26* (2013.01);
(Continued)

(58) Field of Classification Search
None
See application file for complete search history.

(56) References Cited

U.S. PATENT DOCUMENTS 10,535,597 B2 * 1/2020 Chen .................... H01L 21/4803
11,342,255 B2 * 5/2022 Chen .................... H01L 21/6836
(Continued)

FOREIGN PATENT DOCUMENTS

TW 200941675 10/2009
TW 200941675 A * 10/2009
(Continued)

OTHER PUBLICATIONS

"Office Action of Taiwan Counterpart Application", dated Jul. 11, 2022, p. 1-p. 7.

*Primary Examiner* — Telly D Green
(74) *Attorney, Agent, or Firm* — JCIPRNET

(57) ABSTRACT

A packaging structure including first, second, and third dies, an encapsulant, a circuit structure, and a filler is provided. The encapsulant covers the first die. The circuit structure is disposed on the encapsulant. The second die is disposed on the circuit structure and is electrically connected to the circuit structure. The third die is disposed on the circuit structure and is electrically connected to the circuit structure. The third die has an optical signal transmission area. The filler is disposed between the second die and the circuit structure and between the third die and the circuit structure. A groove is present on an upper surface of the circuit structure. The upper surface includes first and second areas located on opposite sides of the groove. The filler directly contacts the first area. The filler is away from the second area. A manufacturing method of a packaging structure is also provided.

18 Claims, 10 Drawing Sheets

(51) Int. Cl.
*H01L 25/00* (2006.01)
*H01L 25/065* (2023.01)
*H01L 25/18* (2023.01)

(52) U.S. Cl.
CPC .......... *H01L 24/96* (2013.01); *H01L 25/0652* (2013.01); *H01L 25/18* (2013.01); *H01L 25/50* (2013.01); *H01L 23/481* (2013.01); *H01L 24/16* (2013.01); *H01L 24/24* (2013.01); *H01L 24/32* (2013.01); *H01L 2224/16145* (2013.01); *H01L 2224/2101* (2013.01); *H01L 2224/221* (2013.01); *H01L 2224/24146* (2013.01); *H01L 2224/26145* (2013.01); *H01L 2224/32145* (2013.01); *H01L 2224/73204* (2013.01); *H01L 2224/73209* (2013.01); *H01L 2224/73217* (2013.01)

(56) References Cited

U.S. PATENT DOCUMENTS

| | | | |
|---|---|---|---|
| 11,488,906 B2* | 11/2022 | Cho | H01L 23/49838 |
| 2011/0095421 A1 | 4/2011 | Kim et al. | |
| 2014/0030855 A1 | 1/2014 | Kim et al. | |
| 2018/0204791 A1* | 7/2018 | Chen | H01L 25/0652 |
| 2020/0152563 A1* | 5/2020 | Chen | H01L 23/49811 |
| 2020/0168552 A1* | 5/2020 | Ha | H01L 23/5385 |
| 2020/0243450 A1* | 7/2020 | Cho | H01L 23/5385 |

FOREIGN PATENT DOCUMENTS

| | | |
|---|---|---|
| TW | 201826483 | 7/2018 |
| TW | 201939685 | 10/2019 |
| TW | 202008546 | 2/2020 |
| TW | 202015137 | 4/2020 |

* cited by examiner

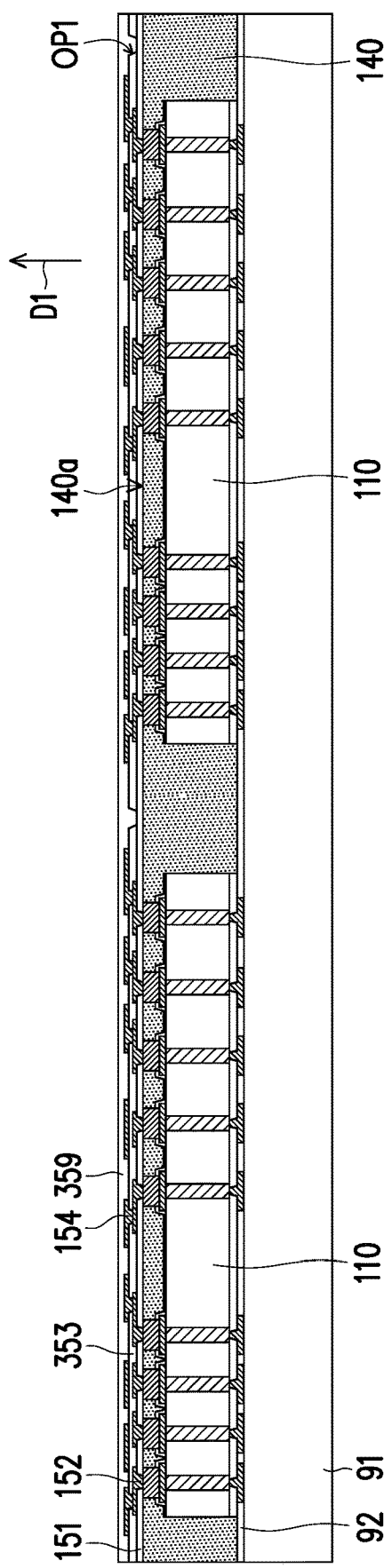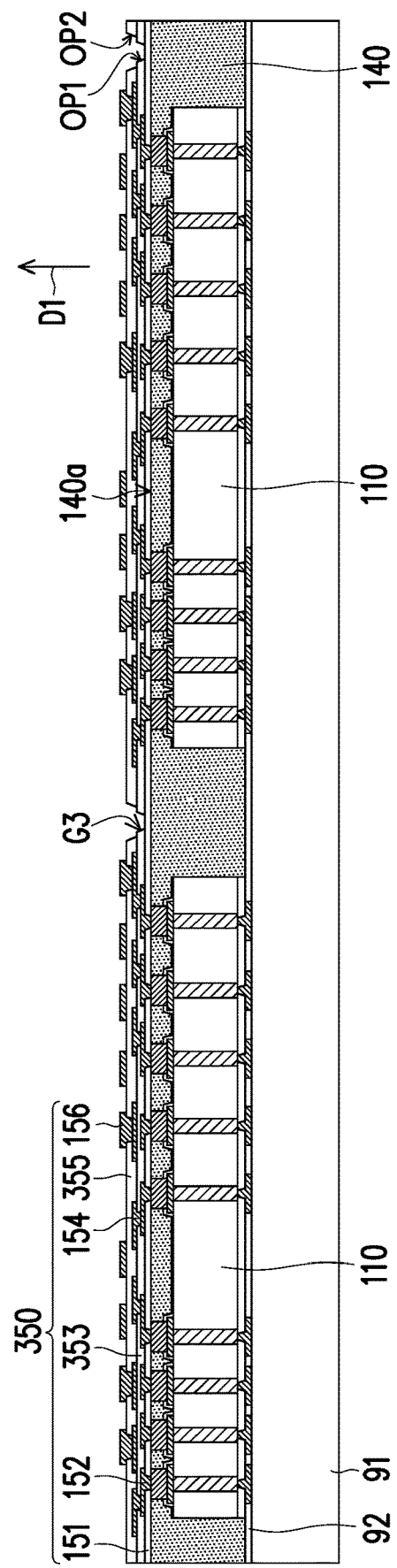
FIG. 3A
FIG. 3B

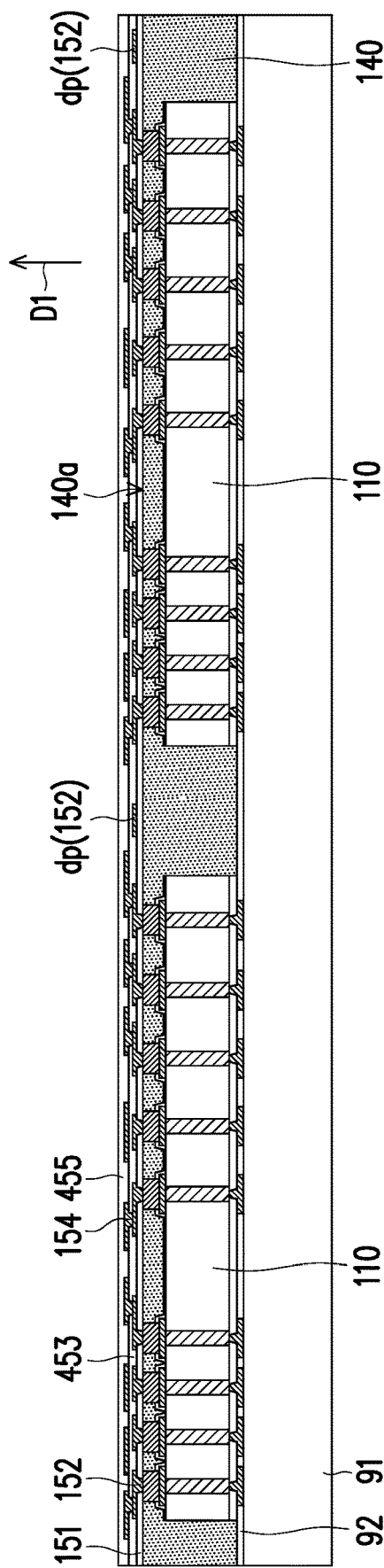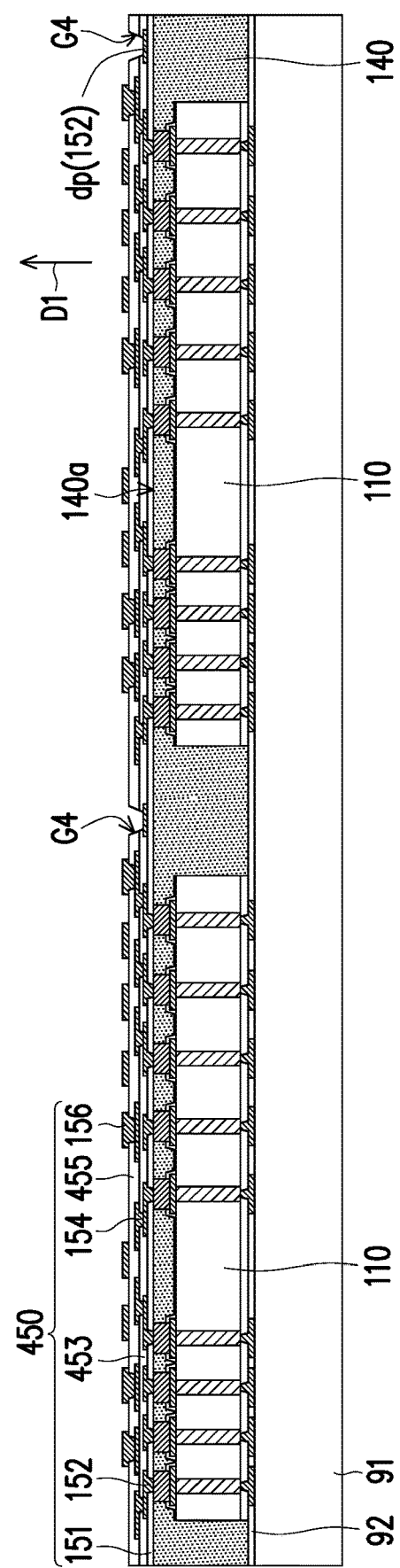

PACKAGE STRUCTURE AND MANUFACTURING METHOD THEREOF

CROSS-REFERENCE TO RELATED APPLICATION

This application claims the priority benefits of U.S. provisional application Ser. No. 63/061,807, filed on Aug. 6, 2020, and Taiwanese application no. 110123671, filed on Jun. 29, 2021. The entirety of each of the above-mentioned patent applications is hereby incorporated by reference herein and made a part of this specification.

BACKGROUND

Technical Field

The disclosure relates to a packaging structure and a manufacturing method thereof. More particularly, the disclosure relates to a packaging structure and a manufacturing method thereof in which a groove is present on a redistribution circuit structure.

Description of Related Art

With an increasing amount of data and/or demands for data centers, demands for silicon photonics integrated circuits also increase gradually. Therefore, how to improve the quality or applicability of a packaging structure having a silicon photonics integrated circuit may have currently become an issue to be addressed.

SUMMARY

The disclosure provides a packaging structure and a manufacturing method thereof, in which quality may be improved.

The packaging structure of the disclosure includes a first die, an encapsulant, a redistribution circuit structure, a second die, a third die, and a filler. The first die includes a silicon substrate and a through silicon conductor penetrating the silicon substrate. The encapsulant covers the first die. The redistribution circuit structure is located on the encapsulant. The second die is disposed on the redistribution circuit structure and is electrically connected to the redistribution circuit structure. The third die is disposed on the redistribution circuit structure and is electrically connected to the redistribution circuit structure. The third die has an optical signal transmission area. The filler is located between the second die and the redistribution circuit structure and between the third die and the redistribution circuit structure. A groove is present on an upper surface of the redistribution circuit structure. The upper surface includes a first area and a second area located on opposite sides of the groove. The filler directly contacts the first area. The filler is away from the second area.

The manufacturing method of a packaging structure of the disclosure includes the following. A preliminary structure is provided, which includes a first die, an encapsulant, and a redistribution circuit structure. The first die includes a silicon substrate and a through silicon conductor penetrating the silicon substrate. The encapsulant covers the first die. The redistribution circuit structure is located on the encapsulant and is electrically connected to the first die. A groove is present on an upper surface of the redistribution circuit structure. The upper surface includes a first area and a second area located on opposite sides of the groove. A second die is disposed on the preliminary structure and is electrically connected to the redistribution circuit structure. A third die is disposed on the preliminary structure and is electrically connected to the redistribution circuit structure. The third die has an optical signal transmission area. A filler is formed between the second die and the redistribution circuit structure and between the third die and the redistribution circuit structure. The filler directly contacts the first area. The filler is away from the second area.

Based on the foregoing, the manufacturing method of a packaging structure of the disclosure may allow the quality of the packaging structure to be improved; and/or the quality of the packaging structure of the disclosure may be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3A to FIG. 3C are each a schematic partial cross-sectional view of a manufacturing method of a packaging structure according to a third embodiment of the disclosure.

FIG. 4A to FIG. 4C are each a schematic partial cross-sectional view of a manufacturing method of a packaging structure according to a fourth embodiment of the disclosure.

DESCRIPTION OF THE EMBODIMENTS

Figure 1A:
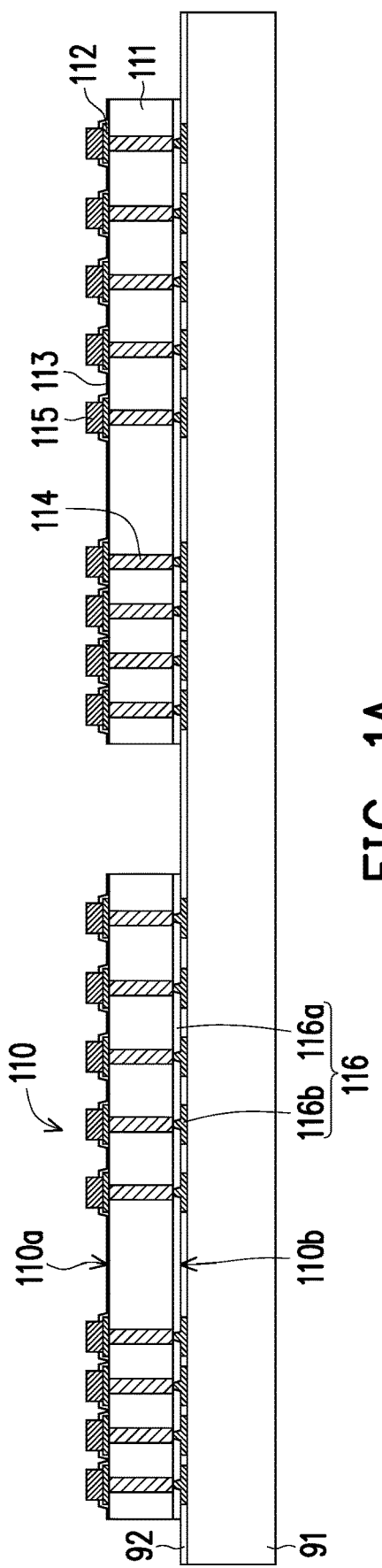
FIG. 1A to FIG. 1F are each a schematic partial cross-sectional view of a manufacturing method of a packaging structure according to a first embodiment of the disclosure.

Unless otherwise expressly stated, directional terms (e.g., up, down, left, right, front, back, top, and bottom) as used herein only serve to be made with reference to the figures as drawn and are not intended to imply absolute orientation.

Unless otherwise expressly stated, it is in no way intended that any method set forth herein be construed as requiring that its steps be performed in a specific order.

The disclosure will be described more comprehensively with reference to the drawings. However, the disclosure may also be embodied in many different forms and should not be limited to the embodiments described herein. For clarity in the drawings, thicknesses, dimensions, or sizes of layers or regions may not be enlarged. The same or similar elements will be denoted with the same or similar reference numerals, and will not be repeatedly described in the following paragraphs.

For clarity in the drawings, part of film layers or members are omitted, and/or another part of film layers or members are drawn in perspective.

Figure 1B:
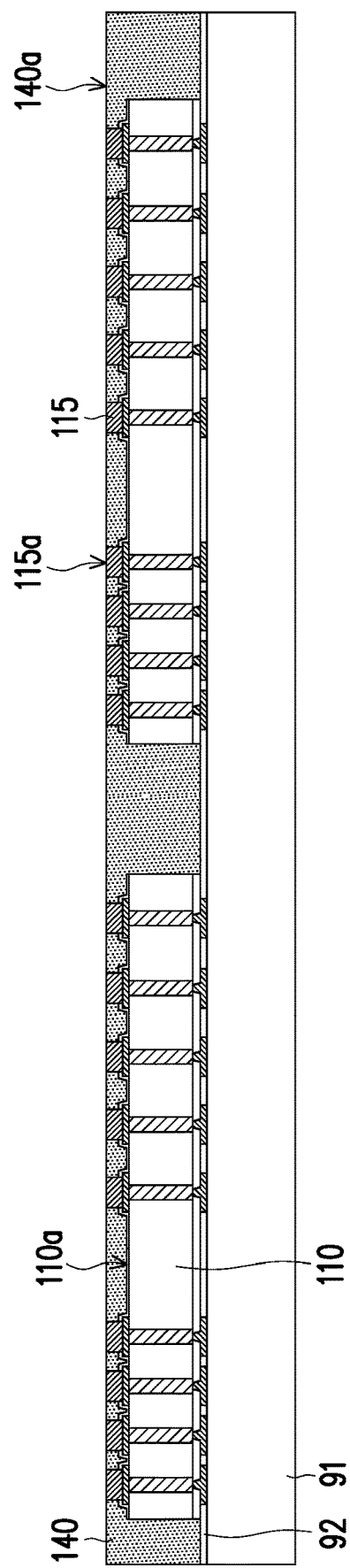
Figure 1C:
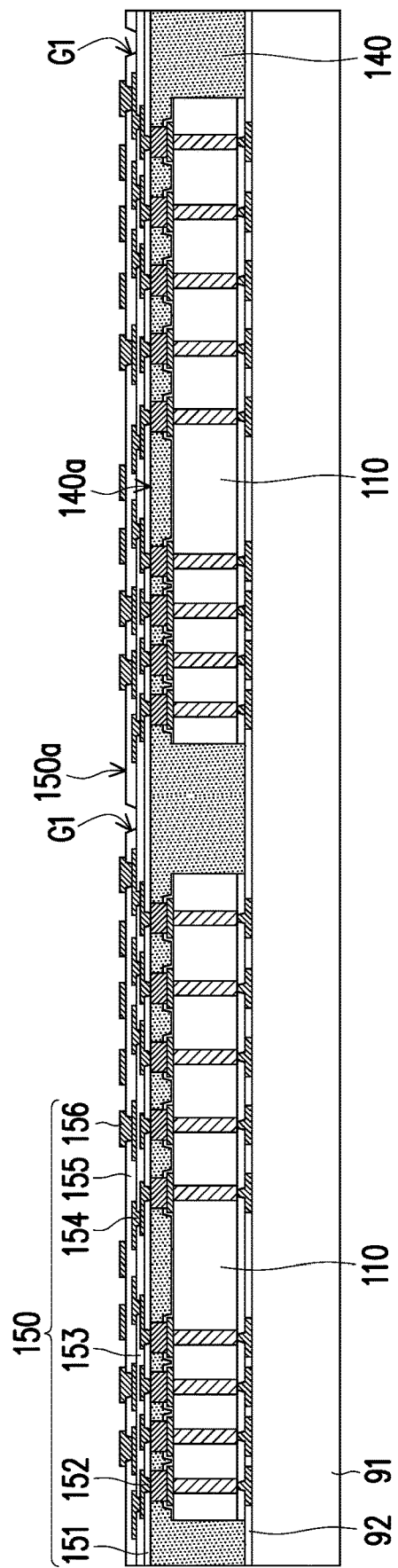
Figure 1D:
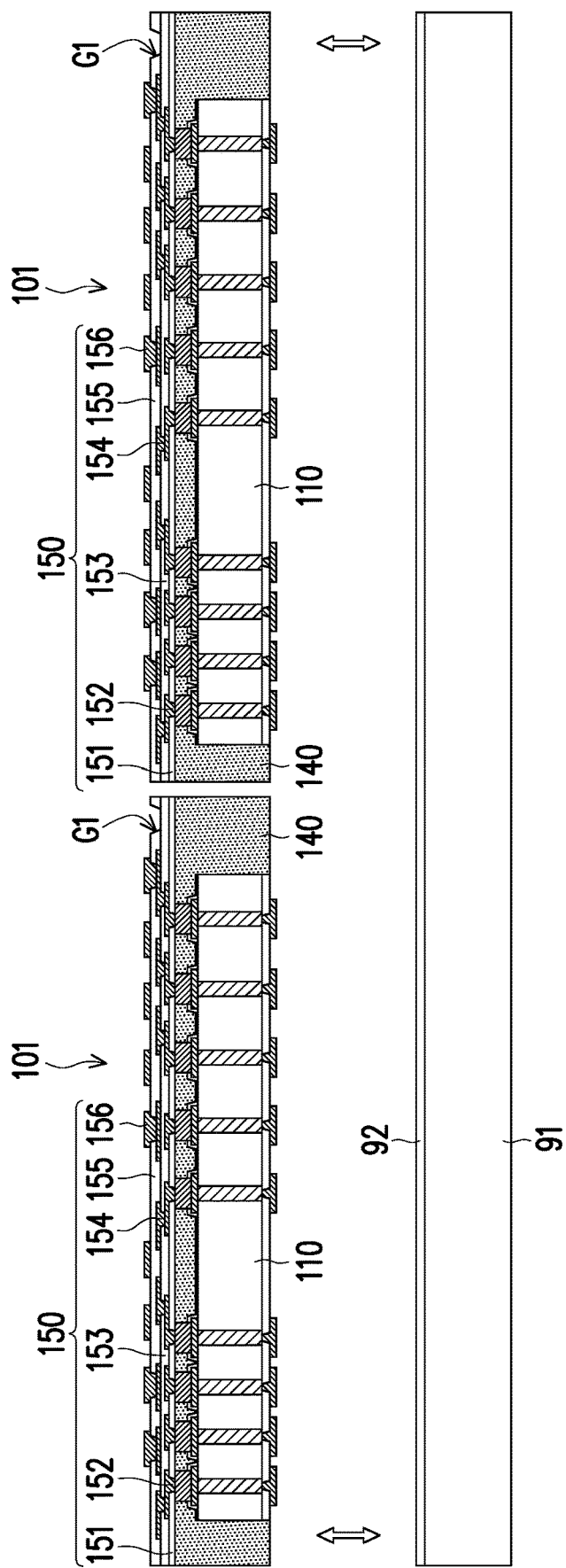
Figure 1E:
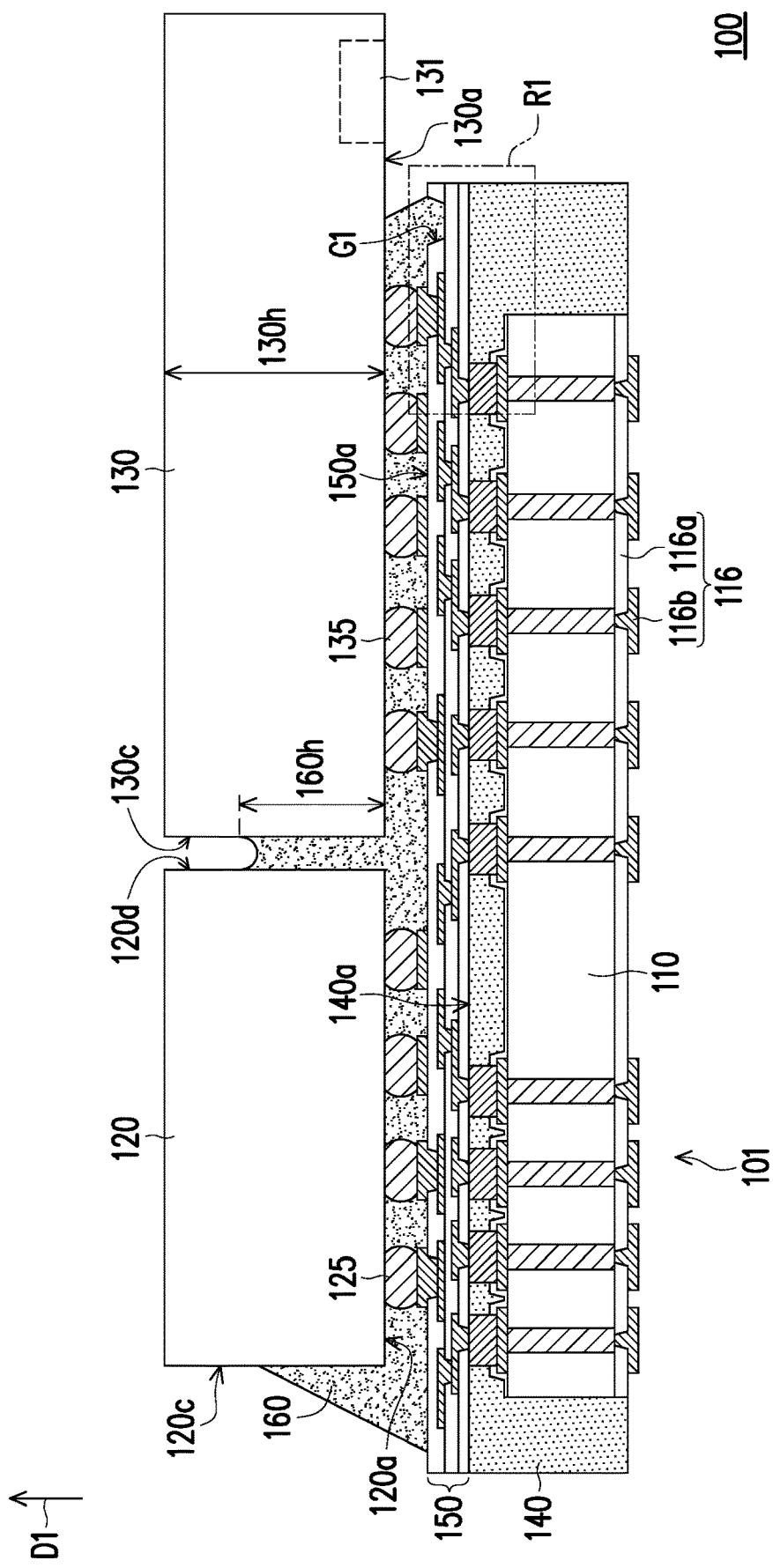
Figure 1F:
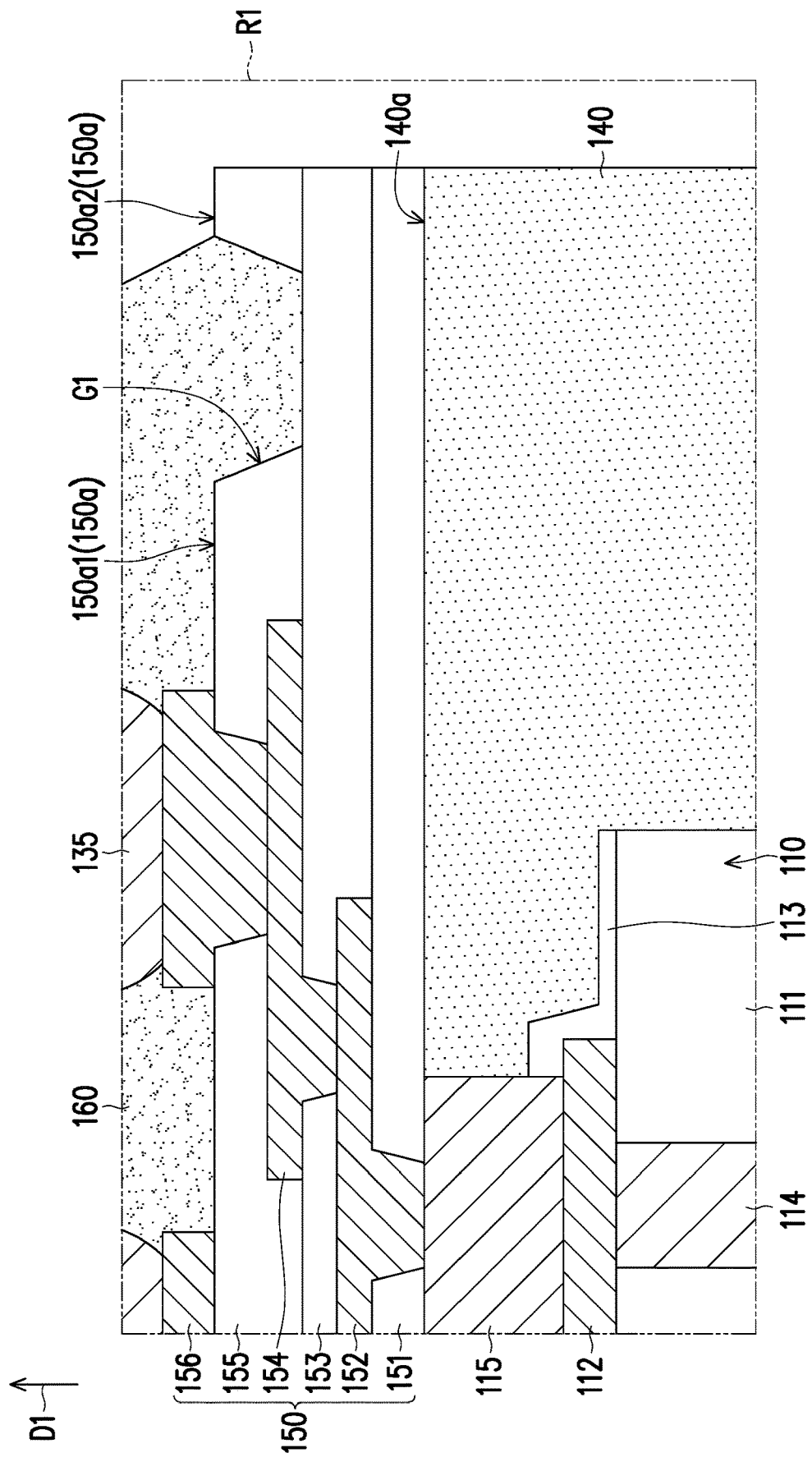
Figure 1G:
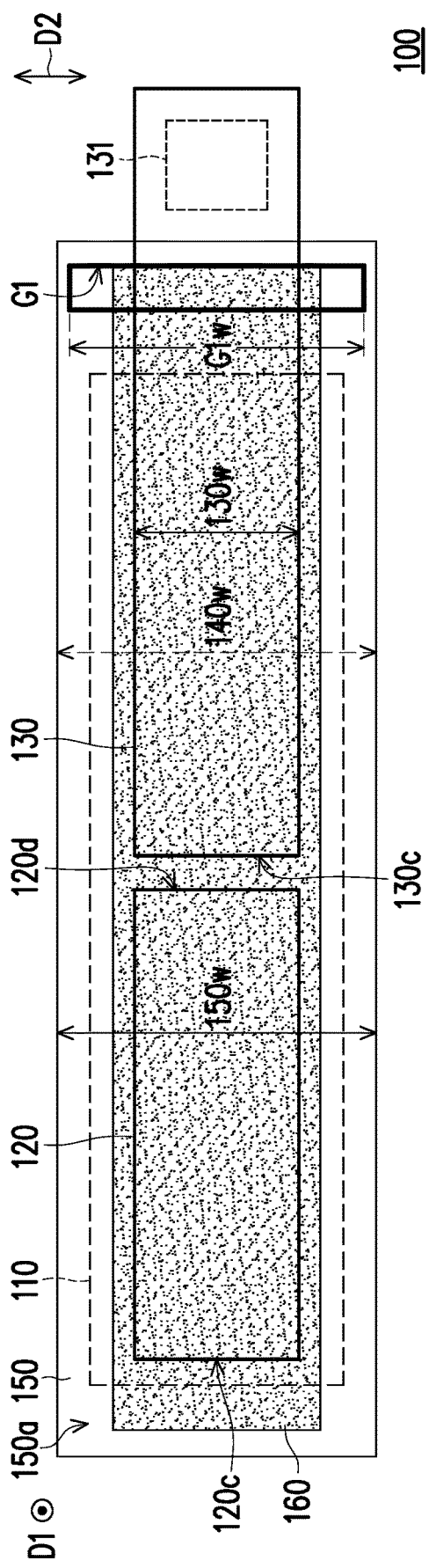
FIG. 1G is a schematic partial top view of a packaging structure according to the first embodiment of the disclosure.

FIG. 1A to FIG. 1F are each a schematic partial cross-sectional view of a manufacturing method of a packaging structure according to a first embodiment of the disclosure. FIG. 1G is a schematic partial top view of a packaging structure according to the first embodiment of the disclosure. FIG. 1F may be a schematic enlarged view of a region R1 in FIG. 1E. FIG. 1G may be a schematic top view of FIG. 1E.

With reference to FIG. 1A, a first die 110 is disposed on a carrier 91. In the disclosure, no particular limits are posed on the carrier 91, as long as the carrier 91 may be adapted to carry film layers formed thereon or the elements disposed thereon.

In an embodiment, the carrier 91 may have a release layer 92, but the disclosure is not limited thereto. The release layer 92 is, for example, a light to heat conversion (LTHC) adhesive layer or other similar release layers 92, and the disclosure is not limited thereto.

In this embodiment, the first die 110 may include a silicon substrate 111, a plurality of die pads 112, a die insulating layer 113, and a through silicon conductor 114. An element area (not shown) is present on one side of the silicon substrate 111. A surface on which the element area is located may be referred to as a first active surface 110a. The surface opposite to the first active surface 110a may be referred to as a first back surface 110b. The die pads 112 may be located on the first active surface 110a. The die insulating layer 113 may cover the die pads 112, and the die insulating layer 113 exposes part of the die pads 112. In the die design, elements in an element area (e.g., elements in the element area of the first die 110) may be electrically connected to corresponding die pads (e.g., part of the die pads 112 of the first die 110) through the corresponding back end of line interconnect (BEOL interconnect). The through silicon conductor 114 may penetrate the silicon substrate 111, and the through silicon conductor 114 may be electrically connected to corresponding die pads (e.g., part of the die pads 112 of the first die 110). Electronic components located at opposite ends of the first die 110 may be electrically connected by the through silicon conductor 114 of the first die 110. In an embodiment, the first die 110 may be referred to as a through silicon via die (TSV die), but the disclosure is not limited thereto.

In this embodiment, first active surface 110a of the first die 110 may have a plurality of metal bumps 115. In subsequent steps, it is possible that the metal bumps 115 may reduce damage caused to the first active surface 110a of the first die 110.

In this embodiment, the first back surface 110b of the first die 110 may have a circuit structure 116. The circuit structure 116 may include an insulating layer 116a and a conductive layer 116b. The corresponding circuit in the conductive layer 116b may be electrically connected to the corresponding through silicon conductor 114.

With reference to FIG. 1A to FIG. 1B, an encapsulant 140 is formed on the carrier 91. The encapsulant 140 may cover the first die 110.

In an embodiment, a molding material (not shown) may be formed on the carrier 91. In addition, after the molding material is cured, a flattening process may be performed to form the encapsulant 140. The flattening process may, for example, include grinding, polishing, or other suitable steps of flattening. The encapsulant 140 may expose an upper surface 115a of the metal bumps 115 of the first die 110. That is, an encapsulant surface 140a of the encapsulant 140 may be coplanar with the upper surface 115a of the metal bumps 115 of the first die 110.

In an embodiment, since the first active surface 110a of the first die 110 has the metal bumps 115, during the step of flattening, it is possible to reduce the possibility of causing damage to the first active surface 110a of the first die 110.

With reference to FIG. 1B to FIG. 1C, a redistribution circuit structure 150 is formed on the encapsulant surface 140a of the encapsulant 140. The redistribution circuit structure 150 may be formed by commonly used semiconductor processes (e.g., coating process, deposition process, lithography process, and/or etching process), and therefore will not be described in detail herein. In addition, in the disclosure, the number of film layers in the redistribution circuit structure 150 and the layout design of the circuit are not limited. For example, as shown in FIG. 1D, the redistribution circuit structure 150 may include three insulating layers 151, 153, 155 and three conductive layers 152, 154, 156.

In an embodiment, the insulating layer 151, the insulating layer 153, and/or the insulating layer 155 may include organic insulating materials (for example, but not limited to, polyimide (PI)), but the disclosure is not limited thereto.

A groove G1 is present on the upper surface 150a of the redistribution circuit structure 150 (i.e., the outer surface farthest away from the encapsulant surface 140a). The groove G1 penetrates at least the top insulating layer 155. The groove G1 may expose the insulating layer 153 located in the lower side (e.g., referring to the lower side of the drawing) of the top insulating layer 155 and directly contacting the top insulating layer 155.

In an embodiment, the groove G1 does not expose any conductive layer in the redistribution circuit structure 150 (so there is no drawing or labeling for absence of exposure), but the disclosure is not limited thereto.

In an embodiment, the groove G1 of the redistribution circuit structure 150 may be formed as exemplified below. An insulating material may be formed on the insulating layer 153 by coating. The insulating material includes, for example, a material that can be cured by light or by heat. Then, part of the insulating material coated on the insulating layer 153 may be cured. Then, the uncured insulating material is removed to form the insulating layer 155. In the insulating layer 155, the groove G1 exposing part of the insulating layer 153 and an opening exposing part of the conductive layer 154 are present. Then, the conductive layer 156 is formed on the insulating layer 155. Part of the conductive layer 156 may be filled into an opening of the insulating layer 155 to be connected (e.g., electrically connected or directly connected) to the conductive layer 154.

With reference to FIG. 1C to FIG. 1D, after the redistribution circuit structure 150 is formed, the carrier 91 may be removed and/or a step of cutting may be performed to form a plurality of preliminary structures 101. The step of cutting is, for example, cutting with a rotating blade or a laser beam, but the disclosure is not limited thereto. It is worth noting that, in the disclosure, the order of removing the carrier 91 and the step of cutting is not limited.

It is worth noting that, after the step of cutting, similar reference numerals will be used for the preliminary structure 101 after the step of cutting. For example, the first dies 110 (shown in FIG. 1C) after cutting may be a plurality of first dies 110 (shown in FIG. 1D), the encapsulant 140 (shown in FIG. 1C) after cutting may be a plurality of encapsulants 140 (shown in FIG. 1D), the redistribution circuit structure 150 (shown in FIG. 1C) after cutting may be a plurality of redistribution circuit structures 150 (shown in FIG. 1D), the grooves G1 (shown in FIG. 1C) after cutting may be a plurality of grooves G1 (shown in FIG. 1D), and so on. The other elements in the preliminary structure 101 will similarly follow the above rule of reference numerals, and will not be repeatedly described or particularly drawn herein.

With reference to FIG. 1D to FIG. 1E, a second die 120 may be disposed on the preliminary structure 101 and be electrically connected to the redistribution circuit structure 150. The second die 120 has a second active surface 120a. The second die 120 is disposed on the redistribution circuit structure 150 with the second active surface 120a facing the redistribution circuit structure 150.

In an embodiment, the second die 120 may include a controller die, but the disclosure is not limited thereto.

In an embodiment, the second die 120 and the redistribution circuit structure 150 may be electrically connected by a second die connector 125. The second die connector 125 is, for example, a solder ball, a conductive post, or other suitable conductive connectors, and the disclosure is not limited thereto.

With reference to FIG. 1D to FIG. 1E, a third die 130 is disposed on the preliminary structure 101 and is electrically connected to the redistribution circuit structure 150. The third die 130 has a third active surface 130a. The third die 130 is disposed on the redistribution circuit structure 150 with the third active surface 130a facing the redistribution circuit structure 150.

The third active surface 130a of the third die 130 has an optical signal transmission area 131. The optical signal transmission area 131 may be adapted to receive or transmit optical signals. In a direction D1 perpendicular to the encapsulant surface 140a, the optical signal transmission area 131 does not overlap the encapsulant 140. That is, at least part (e.g., the part having the optical signal transmission area 131) of the third die 130 is overhung. In an embodiment, the third die 130 may be referred to as a silicon photonics integrated circuit, a photonic integrated circuit (PIC), or an integrated optical circuit, but the disclosure is not limited thereto.

It is worth noting that, in FIG. 1E, the optical signal transmission area 131 is only exemplarily shown. The appearance, film layer, or material of the optical signal transmission area 131 may be adjusted depending on the requirements, and the disclosure is not limited thereto.

In an embodiment, the third die 130 and the redistribution circuit structure 150 may be electrically connected by a third die connector 135. The third die connector 135 is, for example, a solder ball, a conductive post, or other suitable conductive connectors, and the disclosure is not limited thereto.

It is worth noting that, in the disclosure, the order of disposing the second die 120 and disposing the third die 130 is not limited.

With further reference to FIG. 1F, a filler 160 is formed on the redistribution circuit structure 150. Moreover, after the second die 120 and the third die 130 are disposed on the preliminary structure 101 and the filler 160 is formed, the filler 160 is located at least between the third die 130 and the redistribution circuit structure 150; or is further located between the second die 120 and the redistribution circuit structure 150. The filler 160 is, for example, a capillary underfill (CUF) or other suitable filler materials, but the disclosure is not limited thereto.

In this embodiment, it is possible that the third die 130 is first disposed on the preliminary structure 101, and then the filler 160 is formed between the third die 130 and the redistribution circuit structure 150. For example, after the third die 130 is disposed on the preliminary structure 101, a suitable filler material may be injected by a suitable device (for example, but not limited to, a syringe/dispenser/injector) on the upper surface 150a of the redistribution circuit structure 150 from a side surface 130c of the third die 130 (or further from a side surface 120c of the second die 120, for example, between the second die 120 and the third die 130, or from a place of the second die 120 away from the third die 130). The side surface 130c of the third die 130 is opposite to the optical signal transmission area 131 of the third die 130. The uncured filler material may be filled between the third die 130 and the redistribution circuit structure 150 from the side surface 130c of the third die 130, and may further flow toward the groove G1. The speed and/or amount of filling of the filler material may be controlled in a suitable manner. Furthermore, with the groove G1 of the redistribution circuit structure 150, it is possible to prevent the filler material from covering the optical signal transmission area 131 of the third die 130. After that, the filler material may be cured in a suitable manner to form the filler 160.

In this embodiment, the filler 160 may also cover part of the side surface 130c of the third die 130. Accordingly, the bonding between the third die 130 and the redistribution circuit structure 150 may be improved, and the possibility of part of the overhung third die 130 peeling off the redistribution circuit structure 150 may be reduced.

In this embodiment, a height range 160h of the filler 160 covering part of the side surface 130c of the third die 130 may be greater than half of a thickness 130h of the third die 130. Accordingly, the bonding between the third die 130 and the redistribution circuit structure 150 may be further improved. In an embodiment, the filler 160 may completely cover the side surface 130c of the third die 130.

In this embodiment, the range of the filler 160 covering the third active surface 130a of the third die 130 may be greater than half of the third active surface 130a of the third die 130. Accordingly, the bonding between the third die 130 and the redistribution circuit structure 150 may be further improved. Nonetheless, it is worth noting that the filler 160 does not cover the optical signal transmission area 131 of the third die 130. That is, the filler 160 does not completely cover the third active surface 130a of the third die 130.

In an embodiment, the height range 160h of the filler 160 covering part of the side surface 130c of the third die 130 may be greater than half of the thickness 130h of the third die 130, and the range of the filler 160 covering the third active surface 130a of the third die 130 may be greater than half of the third active surface 130a of the third die 130.

In this embodiment, part of the filler 160 may be located between the second die 120 and the third die 130.

In an embodiment, the filler 160 may further cover part of the side surface 120c and/or part of a side surface 120d of the second die 120. The side surface 120c of the second die 120 is away from the third die 130. The side surface 120d of the second die 120 is close to the third die 130.

In an embodiment, a conductive terminal (not shown) may also be formed on the circuit structure 116 of the first die 110 and be electrically connected to the corresponding circuit in the circuit structure 116, but the disclosure is not limited thereto. The conductive terminal may be formed before or after the cutting process, which is not limited by the disclosure.

After the above process, the manufacturing of a packaging structure 100 of this embodiment may be substantially completed.

With reference to FIG. 1E to FIG. 1G, the packaging structure 100 includes the first die 110, the second die 120, the third die 130, the encapsulant 140, the redistribution circuit structure 150, and the filler 160. The first die 110 includes the silicon substrate 111 and the through silicon conductor 114 penetrating the silicon substrate 111. The encapsulant 140 covers the first die 110. The redistribution circuit structure 150 is located on the encapsulant 140. The second die 120 is disposed on the redistribution circuit structure 150 and is electrically connected to the redistribution circuit structure 150. The third die 130 is disposed on the redistribution circuit structure 150 and is electrically connected to the redistribution circuit structure 150. The filler 160 is located between the second die 120 and the redistribution circuit structure 150 and between the third die 130 and the redistribution circuit structure 150. The groove G1 is present on the upper surface 150a of the redistribution circuit structure 150. The upper surface 150a includes a first area 150a1 and a second area 150a2 located on opposite sides of the groove G1. The filler 160 directly contacts the first area 150a1. The filler 160 is away from the second area 150a2.

In an embodiment, the first die 110 may be, for example, an electrical integrated circuit (EIC), an application-specific integrated circuit (ASIC), a controller die, or a die including other suitable elements, but the disclosure is not limited thereto.

In this embodiment, the first die 110 may perform signal and/or power transmission by the corresponding through silicon conductor 114, but the disclosure is not limited thereto.

In this embodiment, the second die 120 may perform signal and/or power transmission by the corresponding second die connector 125, the corresponding circuit in the redistribution circuit structure 150, the corresponding through silicon conductor 114 in the first die 110, and the corresponding circuit in the circuit structure 116; and/or the second die 120 may perform signal and/or power transmission by the corresponding second die connector 125, the corresponding circuit in the redistribution circuit structure 150, and the first die 110, but the disclosure is not limited thereto.

In this embodiment, the third die 130 may perform signal and/or power transmission by the corresponding third die connector 135, the corresponding circuit in the redistribution circuit structure 150, the corresponding through silicon conductor 114 in the first die 110, and the corresponding circuit in the circuit structure 116; and/or the third die 130 may perform signal and/or power transmission by the corresponding third die connector 135, the corresponding circuit in the redistribution circuit structure 150, and the first die 110, but the disclosure is not limited thereto.

In this embodiment, signal and/or power transmission may be performed between the second die 120 and the third die 130 by the corresponding second die connector 125, the corresponding circuit in the redistribution circuit structure 150, and the third die connector 135.

In this embodiment, the second die 120 and the third die 130 may be arranged side by side. For example, the side surface 120d of the second die 120 and the side surface 130c of the third die 130 face each other.

In this embodiment, the groove G1 may be in a stripe shape, but the disclosure is not limited thereto. A side wall of the groove G1 may be an inclined surface. In an extension direction D2 of the groove G1, a dimension G1w of the groove G1 is greater than a dimension 130w of the third die 130. In an embodiment, the dimension G1w of the groove G1 may be less than a dimension 140w of the encapsulant 140 and/or a dimension 150w of the redistribution circuit structure 150 as a whole.

In this embodiment, the filler 160 may also be filled into the groove G1. That is, the filler 160 may directly contact the first area 150a1 and the groove G1, but not the second area 150a2. In this way, the filler 160 between the third die 130 and the redistribution circuit structure 150 may take the groove G1 as the boundary, preventing that the filler 160 may overflow the edge of the redistribution circuit structure 150 and may further cover the optical signal transmission area 131. Accordingly, the quality or yield of the packaging structure 100 may be improved.

In an embodiment, it is possible that the filler 160 is not be filled or partially filled into the groove G1, and the filler 160 does not contact the second area 150a2.

In this embodiment, viewed from the direction D1 perpendicular to the encapsulant surface 140a (as shown in FIG. 1G), the groove G1 is present between any point on the optical signal transmission area 131 and any point on the filler 160. That is, during the manufacturing of the packaging structure 100, it is possible with the groove G1 to ensure that the filler 160 does not cover the optical signal transmission area 131 of the third die 130.

In an embodiment, the packaging structure 100 may optionally further include a conductive terminal (not shown). The conductive terminal may be disposed on the circuit structure 116 of the first die 110, such that the corresponding through silicon conductor 114 in the first die 110 may be electrically connected to external conductive elements through the conductive terminal.

It is worth noting that, in this embodiment, only one first die 110, one second die 120, and one third die 130 are exemplarily shown in the packaging structure 100. Nonetheless, in the disclosure, the number of first dies 110, the number of second dies 120, and the number of third dies 130 in the packaging structure 100 are not limited, and may be adjusted depending on design requirements.

In this embodiment, the number of grooves G1 may be the same as the number of third dies 130, but the disclosure is not limited thereto.

In an exemplary application, a light guide element (for example, but not limited to, an optical fiber) may be configured in contact (e.g., in direct contact, in indirect contact through optical glue, or partially in direct contact and partially in indirect contact) with the optical signal transmission area 131 of the third die 130 of the packaging structure 100, such that the third die 130 may receive or transmit the corresponding optical signal through the light guide element. Therefore, by the configuration of the filler 160 (e.g., configuring the filler 160 to cover the third die 130 as described above), when the light guide element contacts the optical signal transmission area 131 of the third die 130 of the packaging structure 100, the possibility of the third die 130 peeling off the redistribution circuit structure 150 may be reduced. In addition, the groove G1 of the redistribution circuit structure 150 may prevent the filler material from covering the optical signal transmission area 131 of the third die 130. Accordingly, the quality of the packaging structure 100 may be improved.

Figure 2:
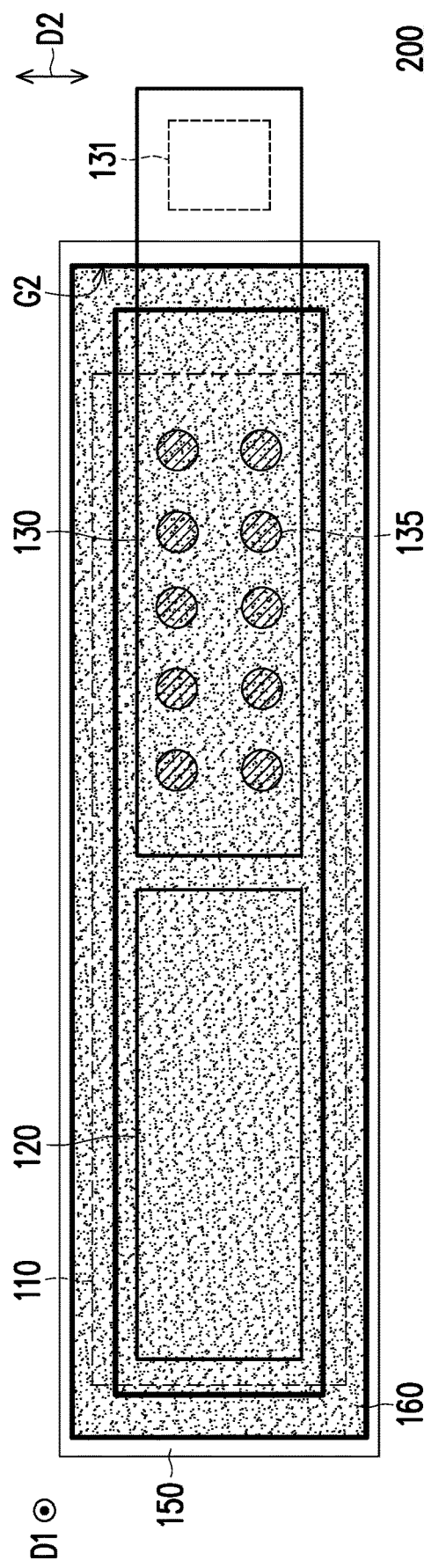
FIG. 2 is a schematic partial top view of a packaging structure according to a second embodiment of the disclosure.

FIG. 2 is a schematic partial top view of a packaging structure according to a second embodiment of the disclosure. In this embodiment, a packaging structure 200 and a manufacturing method thereof are similar to the packaging structure 100 and the manufacturing method thereof in the first embodiment, where similar members are denoted with the same reference numerals and have similar functions, materials, or way of forming, and description thereof will be omitted.

With reference to FIG. 2, in this embodiment, a groove G2 is in an annular shape.

In this embodiment, viewed from the direction D1 perpendicular to the encapsulant surface 140a, the groove G2 may enclose the third die connector 135.

In this embodiment, viewed from the direction D1 perpendicular to the encapsulant surface 140a, the range of the filler 160 may be less than or equal to the range enclosed by the groove G2.

Figure 3C:
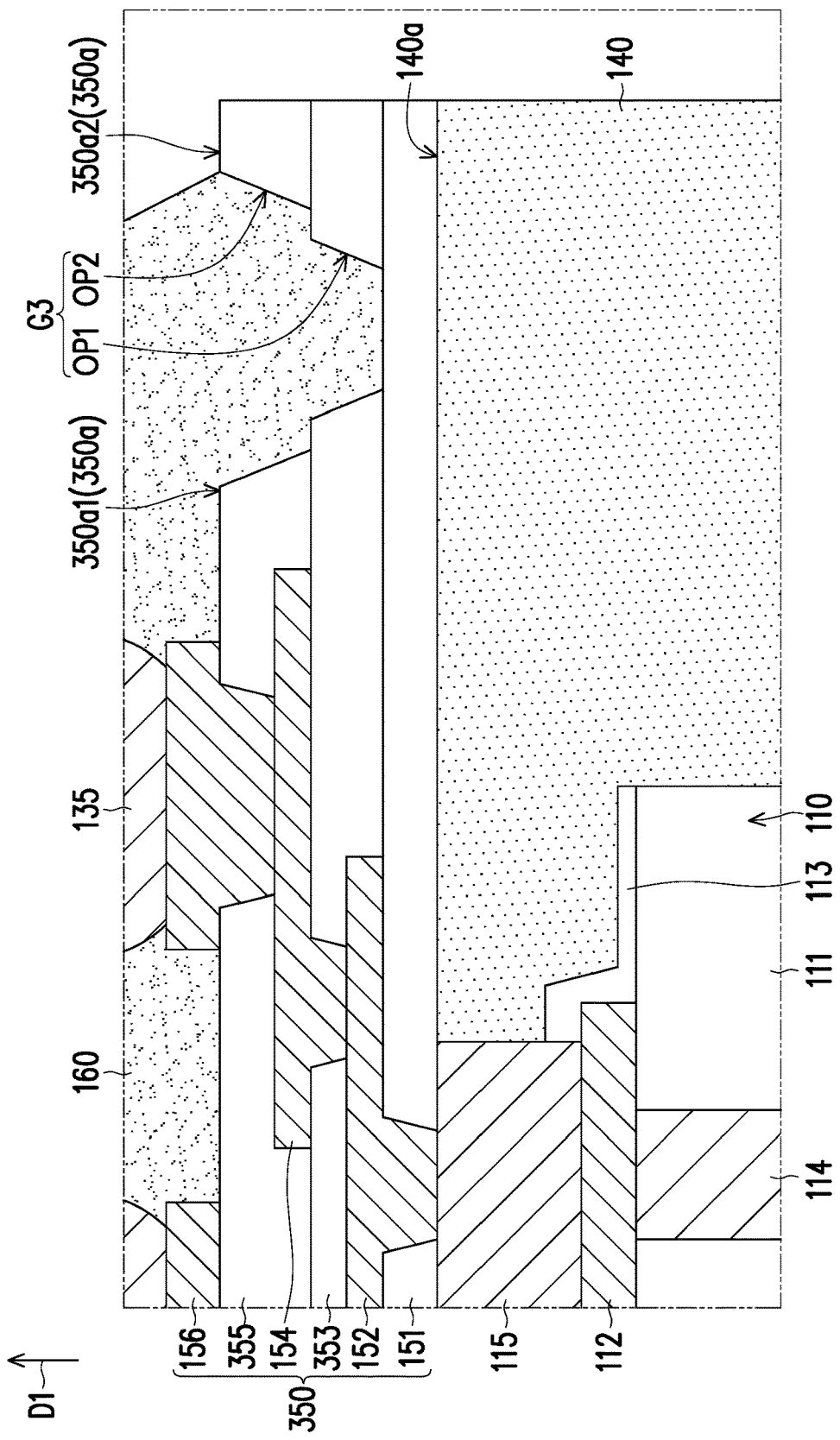

FIG. 3A to FIG. 3C are each a schematic partial cross-sectional view of a manufacturing method of a packaging structure according to a third embodiment of the disclosure. In this embodiment, a packaging structure 300 and a manufacturing method thereof is similar to the packaging structure 100 and the manufacturing method thereof in the first embodiment, where similar members are denoted with the same reference numerals, and have similar functions, materials, or way of forming, and description thereof will be omitted. For example, FIG. 3A is a schematic partial cross-sectional view showing the manufacturing method of a packaging structure following the step of FIG. 1B. The region shown in FIG. 3C may be similar to the region R1 in FIG. 1E.

In this embodiment, a redistribution circuit structure 350 with a groove G3 (labeled in FIG. 3C) is formed as exemplified below.

With reference to FIG. 3A, an insulating material may be formed on the insulating layer 151 by coating. The insulating material includes, for example, a material that can be cured by light or by heat. Then, part of the insulating material coated on the insulating layer 151 may be cured. Then, the uncured insulating material is removed to form an insulating layer 353. In the insulating layer 353, an opening OP1 exposing part of the insulating layer 151 and an opening exposing part of the conductive layer 152 are present. Then, the conductive layer 154 is formed on the insulating layer 353. Part of the conductive layer 154 may be filled into an opening of the insulating layer 353 to be connected (e.g., electrically connected or directly connected) to the conductive layer 152. Then, an insulating material 359 may be formed on the insulating layer 353 by coating. The insulating material 359 may be filled into the opening OP1 of the insulating layer 353. The insulating material 359 includes, for example, a material that can be cured by light or by heat.

With reference to FIG. 3A to FIG. 3B, part of the insulating material 359 may be cured. Then, the uncured insulating material 359 is removed to form an insulating layer 355. In the insulating layer 355, an opening OP2 corresponding to the opening OP1 and an opening exposing part of the conductive layer 154 are present. An opening area of the opening OP2 may be greater than an opening area of the opening OP1. In addition, in the direction D1 perpendicular to the encapsulant surface 140a, an opening range of the opening OP1 may be located within an opening range of the opening OP2.

With further reference to FIG. 3B, the conductive layer 156 is formed on the insulating layer 355. Part of the conductive layer 156 may be filled into an opening of the insulating layer 355 to be connected (e.g., electrically connected or directly connected) to the conductive layer 154.

With further reference to FIG. 3B, after the above process, the manufacturing of the redistribution circuit structure 350 of this embodiment may be substantially completed. The groove G3 of the redistribution circuit structure 350 may be formed of at least the opening OP1 of the insulating layer 353 and the opening OP2 of the insulating layer 355.

With reference to FIG. 3B to FIG. 3C, after that, by the same or similar steps as those shown in FIG. 1D to FIG. 1E, the manufacturing of the packaging structure 300 of this embodiment may be substantially completed.

It should be understood that FIG. 3C is a schematic enlarged view of a region similar to the region R1 in FIG. 1E. Therefore, in FIG. 3C, although part of the members or part of the film layers are not shown, members or film layers same as or similar to those shown in FIG. 1E may be present in other places not shown.

With reference to FIG. 3C, the packaging structure 300 includes the first die 110, the second die (not directly shown, which may be similar to the second die 120 in the above-mentioned embodiment), the third die (not directly shown, which may be similar to the third die 130 in the above-mentioned embodiment), the encapsulant 140, the redistribution circuit structure 350, and the filler 160. The redistribution circuit structure 350 is located on the encapsulant 140. The second die is disposed on the redistribution circuit structure 350 and is electrically connected to the redistribution circuit structure 350. The third die is disposed on the redistribution circuit structure 350 and is electrically connected to the redistribution circuit structure 350. The filler 160 is located between the second die and the redistribution circuit structure 350 and between the third die and the redistribution circuit structure 350. The groove G3 is present on an upper surface 350a of the redistribution circuit structure 350. The upper surface 350a includes a first area 350a1 and a second area 350a2 located on opposite sides of the groove G3. The filler 160 directly contacts the first area 350a1. The filler 160 is away from the second area 350a2.

In this embodiment, a side wall of the groove G3 may have a step structure.

In this embodiment, the groove G3 of the packaging structure 300 may be in a stripe shape (as shown in FIG. 1G), but the disclosure is not limited thereto. In an embodiment, a groove similar to the groove G3 (e.g., a groove having a side wall with a step structure) may be in an annular shape (as shown in FIG. 2).

Figure 4C:
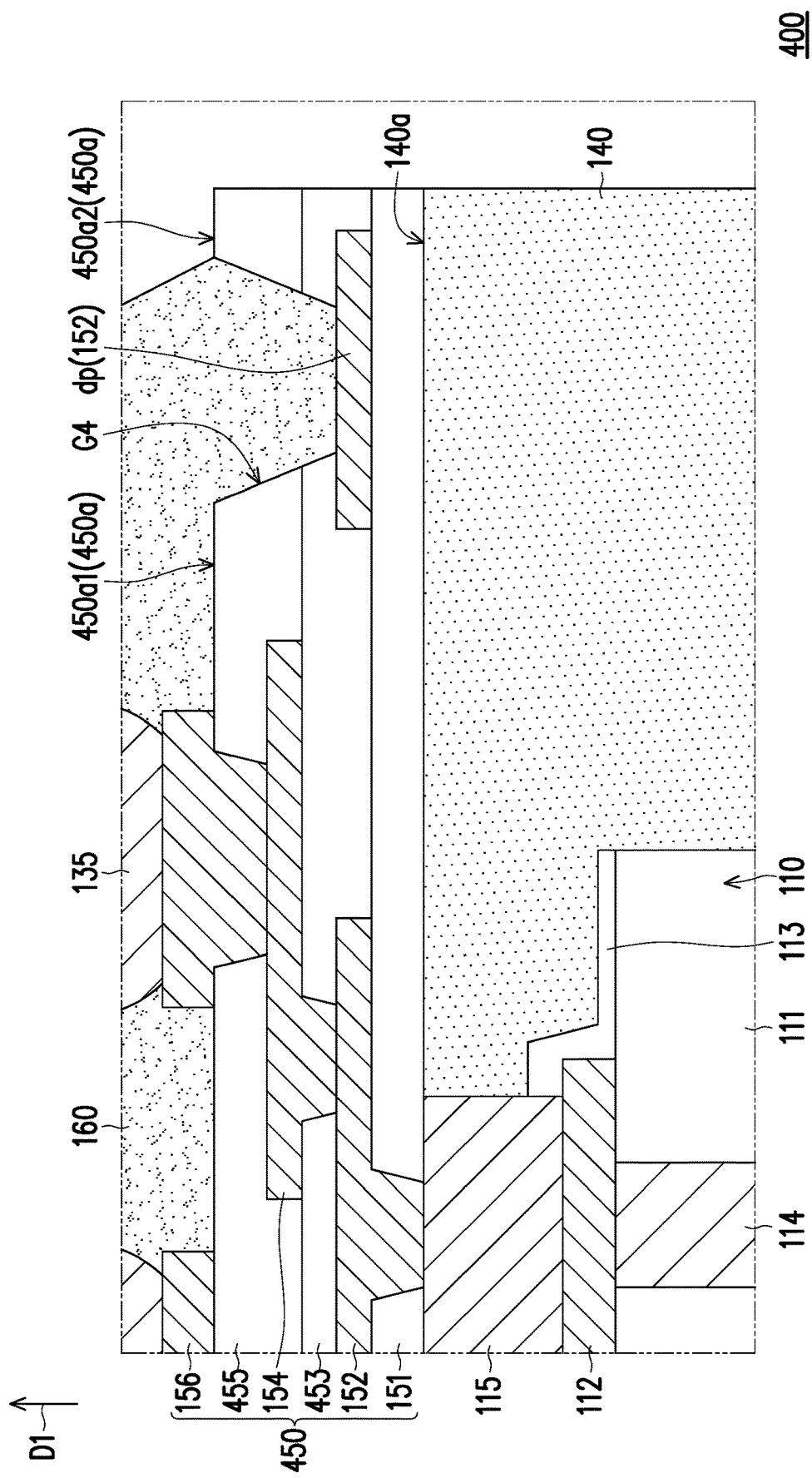

FIG. 4A to FIG. 4C are each a schematic partial cross-sectional view of a manufacturing method of a packaging structure according to a fourth embodiment of the disclosure. In this embodiment, a packaging structure 400 and a manufacturing method thereof is similar to the packaging structure 100 and the manufacturing method thereof in the first embodiment, where similar members are denoted with the same reference numerals, and have similar functions, materials, or way of forming, and description thereof will be omitted. For example, FIG. 4A is a schematic partial cross-sectional view showing the manufacturing method of a packaging structure following the step of FIG. 1B. The region shown in FIG. 4C may be similar to the region R1 in FIG. 1E.

In this embodiment, a redistribution circuit structure 450 with a groove G4 (labeled in FIG. 4C) is formed as exemplified below.

With reference to FIG. 4A, the conductive layer 152 may include a dummy pad dp. Then, an insulating layer 453, the conductive layer 154, and an insulating layer 455 may be formed on the insulating layer 151 by deposition, lithography and/or etching processes.

In an embodiment, the material of the insulating layer 453 and/or the material of the insulating layer 455 may include silicon oxide, silicon nitride, silicon oxynitride, or a combination of the above, but the disclosure is not limited thereto. In a possible embodiment, the material of the insulating layer 453 and/or the material of the insulating layer 455 may include polyimide (PI), polybenzoxazole (PBO), benzocyclobutene (BCB), other suitable polymers, or a combination of the above.

In an embodiment, the material of the insulating layer 453 and the material of the insulating layer 455 may be the same or similar, but the disclosure is not limited thereto.

With reference to FIG. 4A to FIG. 4B, an opening exposing part of the conductive layer 152 and the groove G4 may be formed by etching. The groove G4 may correspond to the dummy pad dp. In an embodiment, the dummy pad dp may be referred to as an etching stop layer, but the disclosure is not limited thereto. Then, the conductive layer 156 is formed on the insulating layer 455. Part of the conductive layer 156 may be filled into an opening of the insulating layer 455 to be connected (e.g., electrically connected or directly connected) to the conductive layer 154.

In this embodiment, the dummy pad dp is part of the conductive layer 152, but the disclosure is not limited thereto. In an embodiment, the dummy pad dp may be part of any conductive layer except the top conductive layer (e.g., conductive layer 156) in the redistribution circuit structure 450.

With reference to FIG. 4B, after the above process, the manufacturing of the redistribution circuit structure 450 of this embodiment may be substantially completed. The groove G4 of the redistribution circuit structure 450 may be located on the dummy pad dp.

With reference to FIG. 4B to FIG. 4C, after that, by the same or similar steps as those shown in FIG. 1D to FIG. 1E, the manufacturing of the packaging structure 400 of this embodiment may be substantially completed.

It should be understood that FIG. 4C is a schematic enlarged view of a region similar to the region R1 in FIG. 1E. Therefore, in FIG. 4C, although part of the members or part of the film layers are not shown, members or film layers same as or similar to those shown in FIG. 1F may be present in other places not shown.

With reference to FIG. 4C, the packaging structure 400 includes the first die 110, the second die (not directly shown, which may be similar to the second die 120 in the above-mentioned embodiment), the third die (not directly shown, may be similar to the third die 130 in the above-mentioned embodiment), the encapsulant 140, the redistribution circuit structure 450, and the filler 160. The redistribution circuit structure 450 is located on the encapsulant 140. The second die is disposed on the redistribution circuit structure 450 and is electrically connected to the redistribution circuit structure 450. The third die is disposed on the redistribution circuit structure 450 and is electrically connected to the redistribution circuit structure 450. The filler 160 is located between the second die and the redistribution circuit structure 450 and between the third die and the redistribution circuit structure 450. The groove G4 is present on an upper surface 450a of the redistribution circuit structure 450. The upper surface 450a includes a first area 450a1 and a second area 450a2 located on opposite sides of the groove G4. The filler 160 directly contacts the first area 450a1. The filler 160 is away from the second area 450a2.

In this embodiment, the groove G4 of the packaging structure 400 may be in a stripe shape (as shown in FIG. 1G), but the disclosure is not limited thereto. In an embodiment, a groove similar to the groove G4 (e.g., a groove penetrating multiple insulating layers and having a side wall that is an inclined surface) may be in an annular shape (as shown in FIG. 2).

In summary of the foregoing, the manufacturing method of a packaging structure of the disclosure may allow the quality of the packaging structure to be improved; and/or the quality of the packaging structure of the disclosure may be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A packaging structure, comprising:
    a first die, comprising a silicon substrate and a through silicon conductor penetrating the silicon substrate;
    an encapsulant, covering the first die;
    a redistribution circuit structure, located on the encapsulant;
    a second die, disposed on the redistribution circuit structure and electrically connected to the redistribution circuit structure;
    a third die, disposed on the redistribution circuit structure and electrically connected to the redistribution circuit structure, wherein the third die has an optical signal transmission area; and
    a filler, located between the second die and the redistribution circuit structure and between the third die and the redistribution circuit structure, wherein:
        a groove is present on an upper surface of the redistribution circuit structure, and the upper surface comprises a first area and a second area located on opposite sides of the groove;
        the filler directly contacts the first area;
        the filler is away from the second area; and
        the redistribution circuit structure is located on an encapsulant surface of the encapsulant, and in a direction perpendicular to the encapsulant surface, the optical signal transmission area of the third die does not overlap at least two of the filler, the redistribution circuit structure, and the encapsulant.

2. The packaging structure as described in claim 1, wherein the filler further covers a part of a side surface of the third die.

3. The packaging structure as described in claim 1, wherein the filler is further filled into the groove.

4. The packaging structure as described in claim 1, wherein the groove has a stripe portion, and in an extension direction of the strip portion of the groove, a dimension of the strip portion of the groove is greater than a dimension of the third die, and the dimension of the strip portion of the groove is less than a dimension of the encapsulant.

5. The packaging structure as described in claim 1, further comprising:
    a plurality of third die connectors, located between the third die and the redistribution circuit structure and electrically connected to the third die and the redistribution circuit structure, wherein the groove is in an annular shape and encloses the plurality of third die connectors.

6. The packaging structure as described in claim 1, wherein the redistribution circuit structure comprises:
    a top insulating layer, wherein the groove penetrates the top insulating layer; and
    a top conductive layer, located on the top insulating layer, wherein a part of the top conductive layer is further embedded in the top insulating layer.

7. The packaging structure as described in claim 1, wherein a side wall of the groove is an inclined plane.

8. The packaging structure as described in claim 7, wherein the redistribution circuit structure comprises a dummy pad, and the groove exposes a surface of the dummy pad.

9. The packaging structure as described in claim 1, wherein a side wall of the groove has a step structure.

10. The packaging structure as described in claim 1, wherein the redistribution circuit structure is disposed between the filler and the encapsulant, and the encapsulant is disposed between the redistribution circuit structure and the first die.

11. The packaging structure as described in claim 10, wherein in the direction perpendicular to the encapsulant surface, the optical signal transmission area of the third die does not overlap the filler or the redistribution circuit structure.

12. The packaging structure as described in claim 1, wherein in a direction perpendicular to the encapsulant surface, the optical signal transmission area of the third die does not overlap the filler, redistribution circuit structure, and the encapsulant.

13. A packaging structure, comprising:
a first die, comprising a silicon substrate and a through silicon conductor penetrating the silicon substrate;
an encapsulant, covering the first die;
a redistribution circuit structure, located on the encapsulant;
a second die, disposed on the redistribution circuit structure and electrically connected to the redistribution circuit structure;
a third die, disposed on the redistribution circuit structure and electrically connected to the redistribution circuit structure, wherein the third die has an optical signal transmission area; and
a filler, located between the second die and the redistribution circuit structure and between the third die and the redistribution circuit structure, wherein:
a groove is present on an upper surface of the redistribution circuit structure, and the upper surface comprises a first area and a second area located on opposite sides of the groove;
the filler directly contacts the first area;
the filler is away from the second area;
the redistribution circuit structure is disposed between the filler and the encapsulant, and the encapsulant is disposed between the redistribution circuit structure and the first die; and
the redistribution circuit structure is located on an encapsulant surface of the encapsulant, and in a direction perpendicular to the encapsulant surface, the optical signal transmission area of the third die does not overlap the filler or the redistribution circuit structure.

14. A manufacturing method of a packaging structure, comprising:
providing a preliminary structure, comprising:
a first die, comprising a silicon substrate and a through silicon conductor penetrating the silicon substrate;
an encapsulant, covering the first die; and
a redistribution circuit structure, located on the encapsulant and electrically connected to the first die, wherein a groove is present on an upper surface of the redistribution circuit structure, and the upper surface comprises a first area and a second area located on opposite sides of the groove;
disposing a second die on the preliminary structure, and electrically connecting the second die to the redistribution circuit structure;
disposing a third die on the preliminary structure, and electrically connecting the third die to the redistribution circuit structure, wherein the third die has an optical signal transmission area; and
forming a filler between the second die and the redistribution circuit structure and between the third die and the redistribution circuit structure, wherein the filler directly contacts the first area, and the filler is away from the second area,
wherein the redistribution circuit structure is located on an encapsulant surface of the encapsulant, and in a direction perpendicular to the encapsulant surface, the optical signal transmission area of the third die does not overlap at least two of the filler, the redistribution circuit structure, and the encapsulant.

15. The manufacturing method as described in claim 14, wherein forming the redistribution circuit structure of the preliminary structure comprises:
forming a top insulating material layer; and
removing a part of the top insulating material layer to form the groove.

16. The manufacturing method as described in claim 15, wherein forming the redistribution circuit structure of the preliminary structure further comprises:
forming the top insulating material layer on a dummy pad; and
removing a part of the top insulating material layer to expose the dummy pad to form the groove.

17. The manufacturing method as described in claim 15, wherein forming the redistribution circuit structure of the preliminary structure further comprises:
forming an insulating layer, wherein an insulating opening is present in the insulating layer;
forming the top insulating material layer on the insulating layer and further filling the top insulating material layer into the insulating opening; and
removing a part of the top insulating material layer located in the insulating opening and corresponding to the insulating opening to form the groove.

18. The manufacturing method as described in claim 15, further comprising:
after forming the groove, performing a step of cutting to form a plurality of preliminary structures.

* * * * *